(12) United States Patent
Hatsch et al.

(10) Patent No.: US 6,977,831 B2
(45) Date of Patent: Dec. 20, 2005

(54) CONTENT ADDRESSABLE MEMORY CELL

(75) Inventors: Joel Hatsch, Unterhaching (DE);
Winfried Kamp, München (DE);
Thomas Künemund, München (DE);
Holger Sedlak, Lochhofen (DE); Heinz Söldner, Bruckmühl-Heufeldmühle (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/943,701

(22) Filed: Sep. 17, 2004

(65) Prior Publication Data

US 2005/0094477 A1 May 5, 2005

Related U.S. Application Data

(63) Continuation of application No. PCT/DE03/00859, filed on Mar. 17, 2003.

(30) Foreign Application Priority Data

Mar. 18, 2002 (DE) ................................ 102 11 957

(51) Int. Cl.[7] ............................................. G11C 15/00

(52) U.S. Cl. ....................... 365/49; 365/63; 365/189.07

(58) Field of Search ............................. 365/49, 189.07, 365/63

(56) References Cited

U.S. PATENT DOCUMENTS

| 5,699,288 | A | | 12/1997 | Kim et al. | |
|---|---|---|---|---|---|
| 5,703,803 | A | | 12/1997 | Shadan et al. | |
| 5,978,246 | A | * | 11/1999 | Shindo | 365/49 |
| 6,101,116 | A | | 8/2000 | Lien et al. | |
| 6,154,384 | A | * | 11/2000 | Nataraj et al. | 365/49 |
| 6,845,026 | B1 | * | 1/2005 | Gharia | 365/49 |
| 2002/0003719 | A1 | | 1/2002 | Nishii et al. | |

OTHER PUBLICATIONS

Masato Motomura, Jun Toyoura, Kazumi Hirata, Hideyuki Ooka, Hachiro Yamada and Tadayoshi Enomoto, *A 1.2-Million Transistor, 33-MHz, 20-b Dictionary Search Processor (DISP) ULSI with a 160-kb CAM*, IEEE Journal of Solid-State Circuits, vol. 25, No. 5, Oct. 1990, pp. 1158-1165.
International Search Report dated Sep. 18, 2003.
International Preliminary Examination Report dated Jul. 30, 2004.

* cited by examiner

*Primary Examiner*—Son T. Dinh
(74) *Attorney, Agent, or Firm*—Patterson & Sheridan, L.L.P.

(57) ABSTRACT

One embodiment provides a content addressable memory cell having a first memory cell which is electrically connected to a comparator unit. The comparator unit is constructed from at least eight transistors, at least four transistors being arranged in a first circuit part and at least four transistors being arranged in a second circuit part and each of the circuit parts having at least two circuit branches.

23 Claims, 6 Drawing Sheets

Fig. 7

CONTENT ADDRESSABLE MEMORY CELL

CROSS-REFERENCE TO RELATED APPLICATIONS

This application is a continuation of co-pending PCT patent application No. PCT/DE03/00859, filed Mar. 17, 2003, which claims the benefit of German patent application serial number DE 102 11 957.0, filed Mar. 18, 2002. Each of the aforementioned related patent applications is herein incorporated by reference in it entirety.

BACKGROUND OF THE INVENTION

1. Field of the Invention

The invention relates to a content addressable memory cell having a first memory cell for storing data, the first memory cell being electrically connected to a first bit line pair for transferring the data from and to the first memory cell and to a comparator unit.

2. Description of the Related Art

Content addressable memory (CAM) cells are often used in integrated circuits. CAMs are memories which, besides read and write accesses, also make it possible to search for an entry. During a search, a search word is compared with a set of stored data. The status of whether the search word corresponds to the stored word is indicated for each stored word. An essential feature of a CAM is that each stored word is identified on the basis of the content of the word itself, instead of by its address in the memory arrangement, as is the case with customary digital memories.

A CAM comprises an arrangement or an array of memory cells that are generally arranged in a matrix made of rows and columns. Each memory cell stores an individual bit of digital information. The bits stored in a row or series of memory elements form a stored word. During an adjusting or hit operation, each search word of the input data is applied to all the rows and, for each row, an indication of whether the word sought corresponds to the word stored therein is generated.

Content addressable memory cells may be designed as binary or ternary CAMs. A binary CAM can store two information states, a logic first ("1") and a logic second ("0") state. Binary CAMs typically have a RAM (random access memory) cell and a comparator unit. The comparator unit compares the comparison data with data that are stored in the RAM cell array and controls an adjusting line during an adjustment with regard to a predefined state. The columns of a binary CAM can generally be masked with external mask data that are stored in one or a plurality of mask registers.

Ternary CAMs are memory chips that can store three states, namely a first logic state, a second logic state and also a so-called "don't care" state for comparison operations. Ternary CAMs generally have in addition to the first RAM cell array also a second RAM cell array or a second RAM cell that stores local mask data for each CAM cell. By way of example, an Ethernet router stores connection data which indicate to the router what IP (Internet Protocol) addresses are allocated to what ports and are forwarded. In this case, the IP addresses are stored within a CAM cell array. If an IP data packet is transferred, a search is made for this IP address in the CAM cell array. If this IP address is found and the adjusting line is activated, the latter then drives a RAM cell array in which this port number is stored. However, generally use is made not of complete IP addresses but rather merely of parts thereof which, in turn, then describe a specific area of a network. For this purpose, so-called network masks are defined which state which bits of an IP address must correspond in order that the IP address is associated with a network. The problem here is that the mask is not identical for all network areas and must be stored. This means for the CAM cell array that each individual bit of the IP address stored there must be individually masked and the CAN cell array must store the masking information directly with each bit of the IP address. Especially, since new chip architectures are intended to be configurable for a plurality of protocols, the mask functionality must be able to be altered between the individual applications (i.e., the mask functionality must be programmable).

A further exemplary application of essentially binary CAMs is afforded by cache memories of processors. The cache memories enable a CPU (central processing unit) to effect a faster data access than in the case of an external RAM. A cache memory always stores the present data or the data processed last, since the probability of the latter being subjected to further processing is relatively high. Since the stored address areas continually change, the associated address word is always stored with respect to each data word. A search is then made for the address word sought by means of the CAM, and the associated found data word is output.

Figure 1:
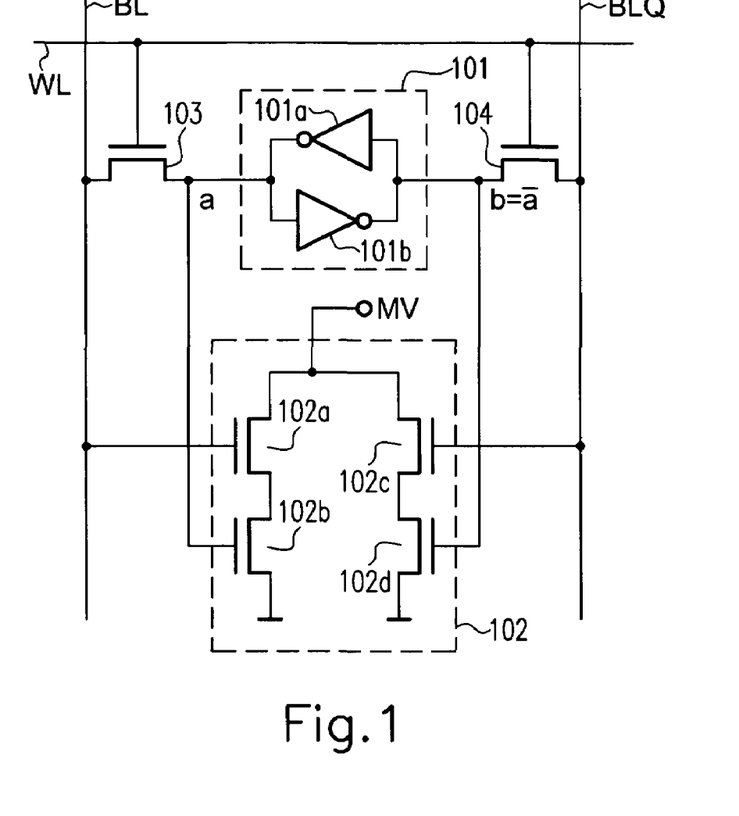
FIG. 1 shows a circuit arrangement of a content addressable memory cell in accordance with the prior art.
Figure 2:
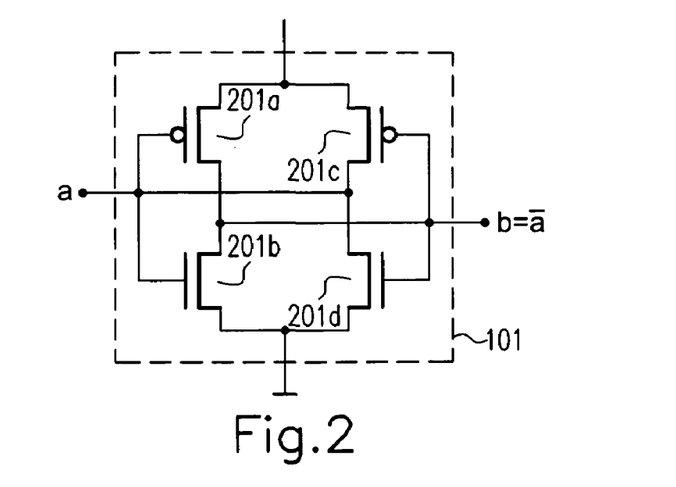
FIG. 2 shows a circuit arrangement of a flip-flop memory cell in accordance with the prior art.

A conventional CAM cell is illustrated in FIG. 1. The CAM cell has an adjusting or hit logic unit 102 as known in the prior art. Each CAM cell stores a data bit within a stored word. In the CAM cell, a memory cell 101 comprises two inverters 101a and 101b, which are connected in the form of a flip-flop. FIG. 2 shows a conventional realization of the flip-flop with two n-type transistors 201b and 201d and two p-type transistors 201a and the 201c. The flip-flop has two states. The signal "a" is high in one state and low in the other state. The signal "b" is always the complement of "a". Bit lines BL and BLQ are connected to the memory cell 101 via access gates, illustrated here as transistors 103 and 104. A word line WL is connected to the gate terminal of each access transistor and extends outward to other cells in the same word row. The adjusting logic unit 102 is connected to the memory cell and to the bit lines. Said adjusting logic unit 102 comprises an output, which is designated by MV and indicates the presence of a correspondence.

The operation of the conventional CAM of FIG. 1 is described below. The bit lines BL and BLQ have two functions. Firstly a read/write function and secondly an adjusting or hit function. To perform a read/write function, the word line WL is used to activate the access transistors 103 and 104. An electrical connection is thus produced between the bit lines BL and BLQ and the two terminals of the memory cell 101. As soon as said connection has been produced, the bit lines can either read the state of the memory cell 101 or write a state to the cell.

If the access transistors 103 and 104 are deactivated, the memory cell 101 is isolated from the two bit lines BL and BLQ. In this case, BL and BLQ can be used for their adjusting function. A state is set onto one of the bit lines. If the state of BLQ corresponds to the state of the signal "a", the MV signal is floating. If it has no correspondence, then MV is pulled low. For example, assuming that the intention is to check whether "a" is high and that a high signal is put onto the line BLQ and a low signal is put onto BL. If "a" is high, the transistor 102b is on whereas the transistor 102a is off (since BL is low), and the transistor 102d is off (because "b" is low) whereas the transistor 102c is on, since a high signal is present on BLQ. MV is thus floating and thereby indicates a correspondence. If "a" is low, the transistors 102b and 102a are off and the transistors 102d and 102c are on (because both BLQ and "b" are high). MV is thus pulled to a low state, thereby indicating no correspondence.

It is therefore evident that when the access transistors 103 and 104 are off and the memory cell 101 is isolated from the bit lines BL and BLQ, the adjusting logic unit 102 can be used to check correspondences between the bit lines and the stored data in the cell.

In the search for correspondences in a CAM, it is known in the prior art to specify the search word, "don't care" in one or more bits. This specification "don't care" means that the CAM cell is to indicate a correspondence independently of the state of its stored bit. A technique for specifying "don't care" in the search word is provided by pulling both the bit line BL and BLQ to a low state.

The technique of specifying "don't care" in the search word is useful only for searching word ranges. For example, to search for all words which lie in the range 1011000 and 1011111, it is possible to specify the search word 1011XXX (where X represents "don't care"). This search word would correspond to all words which fall within the range. This technique can generally be used only for continuous word ranges. By contrast, discontinuous ranges require a plurality of search words.

Particularly when CAMs are used in smart card applications, the embodiment of a CAM with floating nodes is disadvantageous since an unauthorized access can be prevented only to an inadequate extent. Similarly, this relatively poor protection against unauthorized access is afforded in the case of binary CAMs which are not completely constructed from static gates and/or operate with reduced levels.

A CAM cell constructed from six transistors is disclosed in the patent specification U.S. Pat. No. 6,101,116. The CAM cell has an SRAM (static random access memory) cell constructed from a pair of feedback inverters and two access transistors. The SRAM cell stores a data value at an output node at one of the two inverters and an inverse data value at an output node of the other inverter. The two access transistors are in each case connected between an output node and an adjusting line. The adjusting line is connected via the access transistors in such a way that the adjusting line is electrically connected to the output nodes of the SRAM cell if the access transistors are switched on. Data lines are electrically connected to the gate terminals of the access transistors.

A further CAM component specifically embodied as a ternary CAM is disclosed in the patent specification U.S. Pat. No. 6,154,384. The CAM cell has a first memory cell, which is embodied as a RAM cell with two access transistors and two inverters. This first RAM cell is electrically connected to a word line, to a bit line pair, and to a comparator unit. The comparator unit has three transistors, two transistors being electrically connected to a comparison signal line pair and by their gate terminals to the first memory cell. The third transistor produces an electrical connection to a masking circuit formed by a transistor. This transistor has a further connection to an adjusting line. The masking circuit is electrically connected to a masking memory cell constructed as a second RAM cell with two access transistors and two inverters. The access transistors are connected by their gate terminals to a masking word line and in each case by a further terminal to a bit line of the bit line pair.

In the case of the binary CAMs, it is not possible to alter the external mask functionality between the individual applications, i.e., the mask functionality is only one-time programmable, since the comparison algorithm by means of which a search word is compared with the stored comparison words is defined in the semiconductor component and can thus no longer be altered subsequently. In the case of the ternary CAMs, the mask functionality is reconfigurable by means of write operations.

Therefore, there is a need for a content addressable memory cell which can be used to achieve an improved functionality as well as an improved protection against unauthorized access to stored data.

SUMMARY OF THE INVENTION

One embodiment of the invention provides a content addressable memory cell having a RAM cell as first memory cell, the RAM cell being formed with two access transistors and two inverters. The access transistors are electrically connected to a first word line. Furthermore, the first memory cell has an electrical connection to a first bit line pair and to a comparator unit. The comparator unit is connected to an adjusting line.

One aspect of the invention provides that the comparator unit include at least eight transistors. These transistors are arranged in two circuit parts of the comparator unit. The two circuit parts in each case have at least two circuit branches in which in each case at least two transistors are connected up to one another.

The construction according to one aspect of the invention realizes a content addressable memory cell which ensures a high degree of functionality, in particular with regard to a use for various applications in smart cards, and furthermore enables a substantially improved protection with regard to unauthorized access to the data in the content addressable memory cell.

In one exemplary embodiment, at least the two transistors in the circuit branches in each case of the circuit parts are connected in series, it advantageously being the case that the four transistors in the circuit branches of the first circuit part are all of a first type and the four transistors in the circuit branches of the second circuit part are of a second type.

One embodiment provides that the two first circuit branches of the first circuit part on the one hand are electrically connected to the adjusting line via a first node and, in an advantageous manner, the circuit branches of the second circuit part are also electrically connected to the adjusting line via said first node.

In an advantageous manner, the electrical connection between the first memory cell and the comparator unit is configured at least by virtue of the fact that a first transistor of the first circuit branch is electrically connected by its gate terminal to a first output node of the first memory cell and a transistor of the second circuit branch of the first circuit branch is likewise electrically connected by its gate terminal to a second output node of the first memory cell. Furthermore, the electrical connection between the first memory cell and the comparator unit may be characterized in that a transistor of the first circuit branch of the second circuit part is electrically connected by its gate terminal to the second output node of the first memory cell and a transistor of the second circuit branch of the second circuit part is electrically connected by its gate terminal to the first output node of the first memory cell.

In one exemplary embodiment, in particular of a binary CAM cell, the second transistors of the first circuit branches, both of the first and of the second circuit part of the comparator unit, have an electrical connection to the first bit line of the first bit line pair or to a first bit line of a second bit line pair. The second transistors of the second circuit branches of the first and second circuit parts are electrically connected by their gate terminals to the second bit line of the first bit line pair, or, in accordance with the above choice of the alternative, to a second bit line of the second bit line pair.

In an advantageous manner, the content addressable memory cell is embodied in such a way that a second memory cell, in particular for storing a mask bit, is electrically connected to the comparator unit and has two access transistors and also two inverters.

In one embodiment, this content addressable memory cell may be designed as a ternary memory cell, and the comparator unit may include at least thirteen transistors and, consequently, at least five further transistors are arranged in addition to the eight transistors previously mentioned. It is advantageous to apply a supply voltage potential to the second end of the first circuit branch of the first circuit part and to the second end of the second circuit branch of the first circuit branch. It is furthermore advantageous for two of the five additional transistors, which, by way of example, are numbered as ninth and tenth transistors, which are in particular of the first type, to be arranged in the first circuit part. An eleventh transistor, which is of the second type, may be connected in series with the second circuit part. A twelfth transistor and a thirteenth transistor, both of the second type and connected in series, are connected to the adjusting line by one end of the circuit branch thereby produced and are connected to ground potential by the other end.

In one embodiment, the ninth and tenth transistors are connected in the first circuit part in such a way that the gate terminals of the two transistors are electrically connected to one another and that both transistors are connected to the supply voltage potential by a first terminal in each case. The ninth transistor may be electrically connected by a second terminal to the first circuit branch and the tenth transistor may be electrically connected by a second terminal to the second circuit branch.

In an advantageous manner, the eleventh transistor is connected by its gate terminal to the gate terminals of the ninth and tenth transistors and in one embodiment, is electrically connected by its gate terminal to an input of an inverter of the second memory cell.

BRIEF DESCRIPTION OF THE DRAWINGS

A plurality of exemplary embodiments of the invention are explained in more detail below with reference to schematic drawings, in which.

In the figures, identical or functionally identical elements are identified by the same reference symbols.

DETAILED DESCRIPTION OF THE PREFERRED EMBODIMENT

Figure 3:
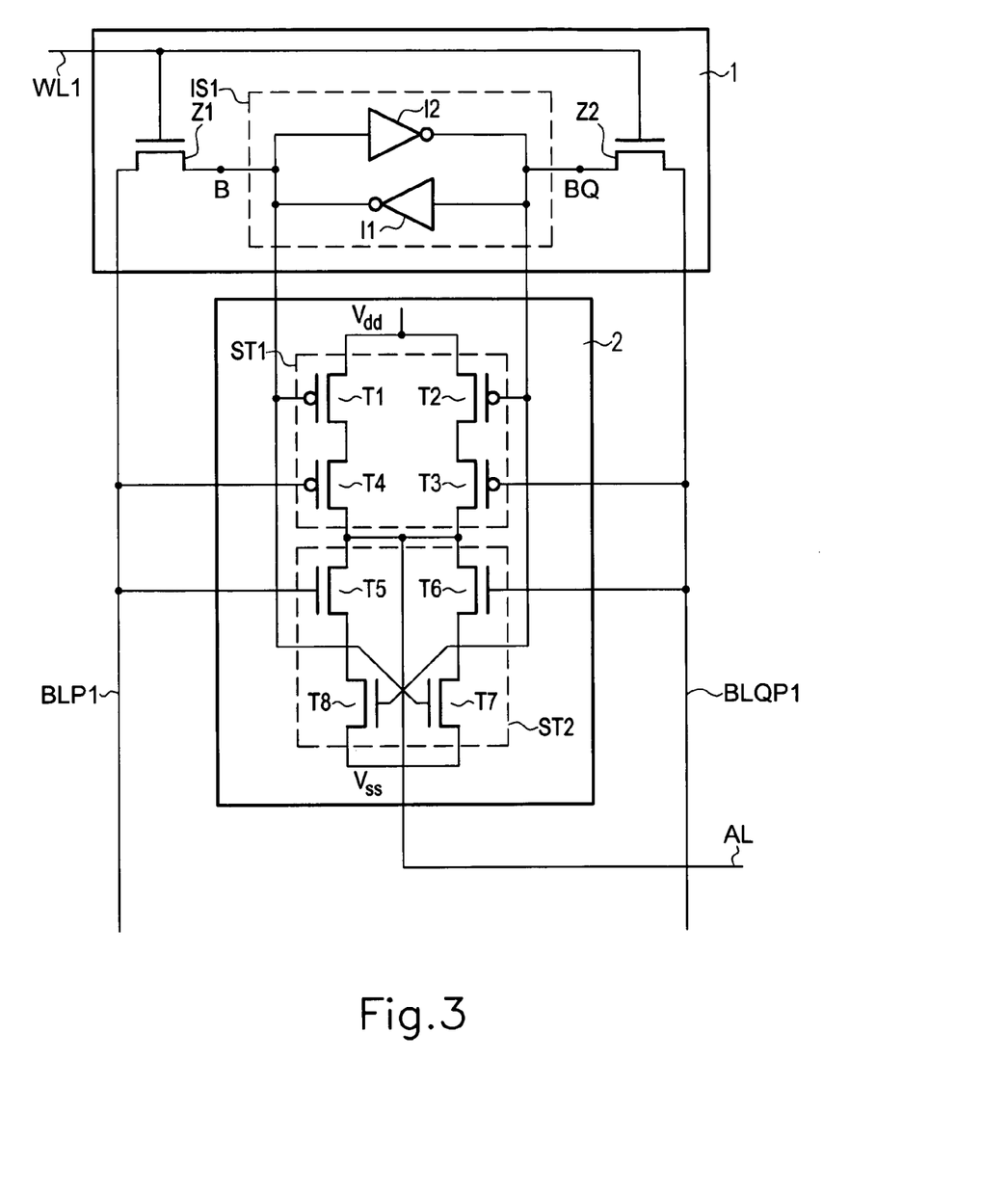
FIG. 3 shows a content addressable memory cell according to a first exemplary embodiment of the invention.

FIG. 3 illustrates a content addressable memory cell having a first memory cell 1. The memory cell 1 is embodied as an SRAM cell and has a first access transistor Z1 and a second access transistor Z2. In the exemplary embodiment, the two access transistors Z1 and Z2 are designed as n-channel transistors and are in each case electrically connected by their gate terminals to a first word line WL1. The first access transistor Z1 is electrically connected by its drain terminal to a first output node of an inverter circuit IS1 which is constructed from the two inverters 11 and 12, and by its source terminal to a first bit line BLP1 of a first bit line pair. At the node B, either a "high" level or a "low" level is generated and the information is stored as a data bit in the memory cell 1.

The second access transistor Z2 is electrically connected by its drain terminal to a second output node of the inverter circuit IS1 and by its source terminal to a second bit line BLQP1 of the first bit line pair. Depending on the state of the node B, an inverted signal with respect to the node B is present at the node BQ and is stored as inverted information as a data bit. Complementary data signals are transferred via the two bit lines BLP1 and BLQP1.

In the first memory cell 1, data are stored which with comparison data that are transferred via comparison data lines, here the bit lines BLP1 and BLQP1. Via the bit lines BLP1 and BLQP1, data are written to the memory cell 1 or are read from the latter if the first memory cell 1 is selected by means of the word line WL1 having a predetermined logic state.

The content addressable memory cell furthermore has a comparator unit 2. The comparator unit 2 has a first circuit part ST1 and a second circuit part ST2. The first circuit part ST1 has two circuit branches, the first circuit branch being constructed from two series-connected p-channel transistors T1 and T4 and the second circuit branch likewise being constructed from two series-connected p-channel transistors T2 and T3. The transistors T1 and T2 are connected to a supply voltage potential $V_{dd}$ by their source terminals. The transistor T1 is connected by its drain terminal to the source terminal of the transistor T4. The transistor T1 is connected by its gate terminal to the first output node of the first memory cell 1 or the inverter circuit IS. The transistor T2 is connected by its drain terminal to the source terminal of the transistor T3. The transistor T2 is electrically connected by its gate terminal to the second output node of the inverter circuit IS1. The two transistors T3 and T4 are in each case connected by their drain terminals to the adjusting line AL via a node. The transistor T3 is connected by its gate terminal to the bit line BLQP1, and the transistor T4 is connected by its gate terminal to the bit line BLP1.

The second circuit part ST2 of the comparator unit 2 has four transistors T5 to T8, which are designed as n-channel transistors in the exemplary embodiment. In a first circuit branch of the second circuit part ST2, the two transistors T5 and T8 are connected in series, the drain terminal of the transistor T8 being connected to the source terminal of the transistor T5, the source terminal of the transistor T8 being connected to ground potential $V_{ss}$ and the drain terminal of the transistor T5 being connected to the adjusting line AL. The gate terminal of the transistor T5 is connected to the bit line BLP1 and the gate terminal of the transistor T8 is connected to second output node of the inverter circuit IS1. In the second circuit branch of the second circuit part ST2, the two transistors T6 and T7 are connected in series, the drain terminal of the transistor T7 being connected to the source terminal of the transistor T6 and the source terminal of the transistor T7 being connected to ground potential $V_{ss}$. The gate terminal of the transistor T7 is connected to the first output node of the inverter circuit IS1. The transistor T6 is electrically connected by its drain terminal to the adjusting line AL and by its gate terminal to the bit line BLQP1.

During a comparison operation, i.e., the access transistors Z1 and Z2 are deactivated, the data stored in the first memory cell 1 are compared, by means of the comparator unit 2, with comparison data that are transmitted via the bit lines BLP1 and BLQP1 in the exemplary embodiment.

The content addressable memory cell embodied in accordance with FIG. 3 is designed as a binary memory cell. By virtue of the arrangement of the four transistors T1 to T4 in the first circuit part ST1 and the interconnection thereof, it is possible to detect a correspondence or a deviation of data stored in the first memory cell 1 with comparison data. The four transistors T5 to T8 in the second circuit part ST2 in the comparator unit 2 make it possible to hold the adjusting line AL at an absolute "low" potential upon identification of a deviation during the comparison of the above-mentioned data. Said absolute "low" potential setting of the adjusting line AL is furthermore also possible and ensured during the precharge of the bit lines BLP1 and BLQP1. Prior to a comparison operation, by means of the second circuit part ST2, the adjusting line AL is precharged to the corresponding potential, to a "low" state in the exemplary embodiment, if the two bit lines BLP1 and BLQP1 are put at a "high" state.

Also, the first memory cell 1 may be connected at the first bit line pair BLP1 and BLQP1 for reading and writing data to and from the memory cell 1. In such case, the transistors T4 and T5 are electrically connected to a first bit line of a second bit line pair, and the transistors T3 and T6 are electrically connected to a second bit line of the second bit line pair for searching for or comparing data.

The preconditions that no floating nodes are present in the comparator unit of the content addressable memory cell and furthermore, that all nodes operate with complete levels, which preconditions are necessary and essential in particular for smart card applications on account of security requirements with regards to unauthorized access and manipulation of the data, can be fulfilled by means of the invention's design of the comparator unit. The invention's design of the comparator unit realizes a complete static solution approach of the circuit without a floating node.

The functioning during an adjusting operation or comparison operation of data stored in the first memory cell 1 with comparison data of the binary CAM cell illustrated in FIG. 3 is explained below. The word line WL1 has a logic "low" state, as a result of which the access transistors Z1 and Z2 are deactivated and the first memory cell 1 is isolated from the two bit lines BLP1 and BLQP1. If a logic state "1", for example, is stored in the first memory cell 1, then the logic "high" state is stored in the node B and the logic "low" state is stored in the node BQ. If it is furthermore assumed, for example, that the comparison data have the logic state "1" and that the bit line BLP1 has a "high" state whereas the bit line BLQP1 has a "low" state. On the basis of these preconditions, the transistors T2, T3, T5 and T7 are switched on and the transistors T1, T4, T6 and T8 are switched off. Only the signal path identified through the second circuit branch of the first circuit part ST1 by the transistors T2 and T3 is switched, and the adjusting line AL, which is precharged to a "low" state, is subjected to charge reversal. A correspondence between the stored data and the comparison data is thus identified.

A correspondence between the stored data and the comparison data also occurs in the case where a logic state "0" is stored in the first memory cell 1 and the bit line BLP1 has a "low" state. As a result, the node B has a "low" state and the node BQ has a "high" state. The transistors T1, T4, T6 and T8 are switched on and the transistors T2, T3, T5 and T7 are switched off. The adjusting line AL having the "low" state is in this case connected to the supply voltage potential $V_{dd}$ via the first circuit branch of the first circuit part ST1, which is formed by the transistors T1 and T4, and the adjusting line AL is subjected to charge reversal.

If the logic state "1" is stored in the first memory cell 1 and the bit line BLP1 has a "low" state, i.e., the comparison data have the logic state "0", the node B has a "high" state and the node BQ has a "low" state. The transistors T2, T4, T6 and T7 are switched on and the transistors T1, T3, T5 and T8 are switched off. As a result, the adjusting line AL at the "low" state is furthermore held at the "low" state via the second circuit branch of the second circuit part ST2, which is formed by the two transistors T6 and T7, and a deviation between the stored data and the comparison data is identified.

A deviation of the stored data from the comparison data is also identified when the node B has a "low" state and the bit line BLP1 has a "high" state. In this case, the adjusting line AL charged to the "low" state is furthermore held at the "low" state via the first circuit branch of the second circuit part ST2, which is formed by the two transistors T5 and T8.

Figure 4:
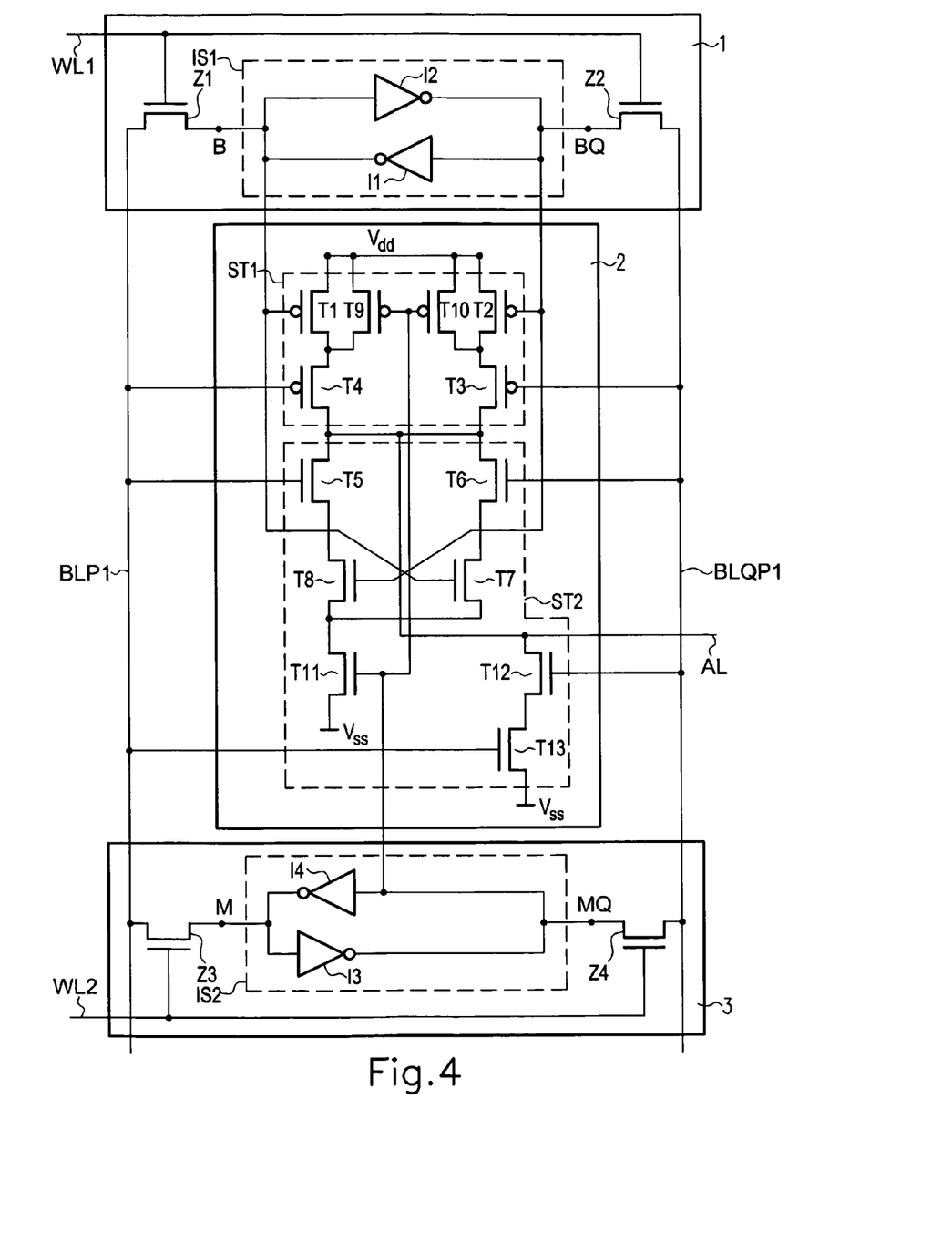
FIG. 4 shows a content addressable memory cell according to a second exemplary embodiment of the invention.

FIG. 4 illustrates a content addressable memory cell designed as a ternary CAM cell according to another exemplary embodiment of the invention. The first memory cell 1 is designed in a manner corresponding to the first memory cell 1 in FIG. 3. The comparator unit 2 has the eight transistors T1 to T8 arranged in a similar manner corresponding to respective parts of FIG. 3. The transistors T1 and T2 are connected to a supply voltage potential $V_{dd}$ by their source terminals. In addition to the eight transistors T1 to T8, the comparator unit 2 has five transistors T9 to T13. In the exemplary embodiment shown in FIG. 4, the transistors T9 and T10 are designed as p-channel transistors and arranged in the first circuit part ST1. The transistor T9 is connected to the supply voltage potential $V_{dd}$ by its source terminal and is connected by its drain terminal to the first circuit branch. The gate terminal of the transistor T9 is connected to the gate terminal of the transistor T10, and both gate terminals additionally have an electrical connection to a second memory cell 3. The source terminal of the transistor T10 is likewise connected to the supply voltage potential $V_{dd}$ and its drain terminal is electrically connected to the second circuit branch of the first circuit part ST1.

A further transistor T11 is connected by its drain terminal in series with the source terminals of transistors T7 and T8 of the second circuit part ST2 and is connected by its source terminal to ground potential $V_{ss}$. The gate terminal of the transistor T11 is electrically connected to the gate terminals of the transistors T9 and T10 and also to an inverter circuit IS2 arranged in a second memory cell 3. The transistors T12 and T13 are connected in series with one another, the transistor T12 being connected by its drain terminal to the adjusting line AL and being connected by its gate terminal to the second bit line BLQP1 of the first bit line pair. The transistor T13 is electrically connected by its gate terminal to the first bit line BLP1.

In addition to the inverter circuit IS2 formed from the inverters I3 and I4, the second memory cell 3 has two access transistors Z3 and Z4 which are connected by their gate terminals to a second word line WL2. The access transistors Z3 and Z4 are connected by their drain terminals to the inverter circuit IS2. The transistor Z3 is connected by its source terminal to the bit line BLP1 and the transistor Z4 is connected by its source terminal to the bit line BLQP1. The second memory cell 3 serves for the local storage of the masking information items. At the node M, either a "high" level or a "low" level is generated, and the information is stored as a mask bit. Depending on the state of the node M, the node MQ has a charge state which has an inverted signal with respect to the node M and is stored as inverted information and as a mask bit. In this exemplary embodiment, the writing or reading of a masking information item to or from the second memory cell 3 is carried out via the bit line pair BLP1 and BLQP1 and via the second word line WL2.

An SRAM cell is advantageously used for storing the mask bit in the second memory cell 3. The SRAM cell has the advantages over an alternative design of the memory cell 3 as a DRAM cell that, firstly, it is not a volatile memory cell and does not require a refresh cycle for guaranteeing the required potential, and secondly, it is less sensitive to external interference influences, as a result of which the security of the content addressable memory cell may be improved.

The functioning during an adjusting operation or comparison operation of data stored in the first memory cell 1 with comparison data of the ternary CAM cell illustrated in FIG. 4 is explained below. The word line WL1 has a logic "low" state, as a result of which the access transistors Z1 and Z2 are deactivated and the first memory cell 1 is isolated from the two bit lines BLP1 and BLQP1. If a logic state, "1" for example, is stored in the first memory cell 1, then the logic "high" state is stored in the node B, and the logic "low" state is stored in the node BQ. If it is furthermore assumed, for example, that the comparison data have the logic state "1", then the bit line BLP1 has a "high" state, and the bit line BLQP1 has a "low" state.

As a result, the transistors T1 to T8 are switched on or off in accordance with the case described in the corresponding example with respect to FIG. 3. If the second word line WL2 is then at a "low" state, the access transistors Z3 and Z4 are deactivated and the second memory cell 3 is isolated from the bit lines BLP1 and BLQP1. If a logic state "1" is then stored as a mask bit in the second memory cell 3, for example, then the node M has a "high" state and the node MQ has a "low" state. The transistors T9 to T11 connected to the node MQ receive a corresponding signal and the transistors T9 and T10 are switched on and the transistor T11 is switched off. The transistors T9 and T10 mask the transistors T1 and T2 and the first circuit branch is activated since the transistor T3 is also switched on. The stored data bit in the first memory cell 1 is thus masked, and a correspondence is output.

If, in a further case, the node B is at a "high" state and the bit line BLP1 is a "low" state, the transistors T2, T4, T6 and T7 are switched on and the transistors T1, T3, T5 and T8 are switched off. Thus, neither of the two circuit branches of the first circuit part ST1 is activated. The adjusting line AL would furthermore be held at the "low" state, and no deviation would be identified during the comparison. However, the transistors T9 and T10 are activated by the signal from the node MQ, and the transistor T11 is switched off. Thus, an activated circuit branch comprising the transistors T9 and T4 is then produced, as a result of which the adjusting line AL and is subjected to charge reversal to the "high" state. Thus, in this case, independently of the result of the comparison of the stored data with the comparison data (e.g., in this case no correspondence) by virtue of the masking, a correspondence is generated and identified.

This example is intended to be given only to illustrate the functioning. As already explained with regard to the functioning of the CAM cell illustrated in FIG. 3, even further combinations of states of the nodes B and BQ and also of the bit lines BLP1 and BLQP1 are possible and can be comprehended in a simple manner for the exemplary embodiment in FIG. 4 and also for the exemplary embodiments illustrated in FIGS. 5 to 7.

Consequently, by means of a masking, independently of the result produced by a comparison of stored data with comparison data (i.e., correspondence or deviation), a correspondence is output since it is always the case that either the first or the second circuit branch of the first circuit part ST1 is activated (e.g., either T9 and T4 or T3 and T10) and the adjusting line AL is subjected to charge reversal to the "high" state. This is also applicable in the subsequent exemplary embodiments in FIGS. 5 to 7.

The transistors T12 and T13 in the comparator unit 2 control the precharge of the adjusting line AL, which is precharged to the "low" state, for example. The precharging of the adjusting line AL is carried out by means of the transistors T12 and T13, which are both switched on if the bit lines BLP1 and BLQP1 both have a "high" state.

By means of the additional five transistors T9 to T13 in the comparator unit 2, the masking functionality is integrated directly into the basic cell of the content addressable memory cell, as a result of which the mask can be changed at any time by means of a mask writing operation. As already mentioned, these five transistors T9 to T13 overdrive or mask the transistors T1 to T8 provided for a comparison operation. When the transistors T1 to T8 compare a stored bit with a sought bit, the resulting one bit is masked by the content of the second memory cell 3 during the search. Moreover, the transistors T9 to T13 enable the comparator unit 2 to be held at a defined and stable state in the precharge state. This is advantageous in particular in comparison with content addressable memory cells with floating nodes, in the case of which this has been essentially not possible prior to this invention.

In one embodiment, a "low" level at the node M and a "high" level at the node MQ may be present and stored for masking purposes. The transistors T9, T10 and T11 must then be electrically connected by their gate terminals to the node M.

Figure 5:
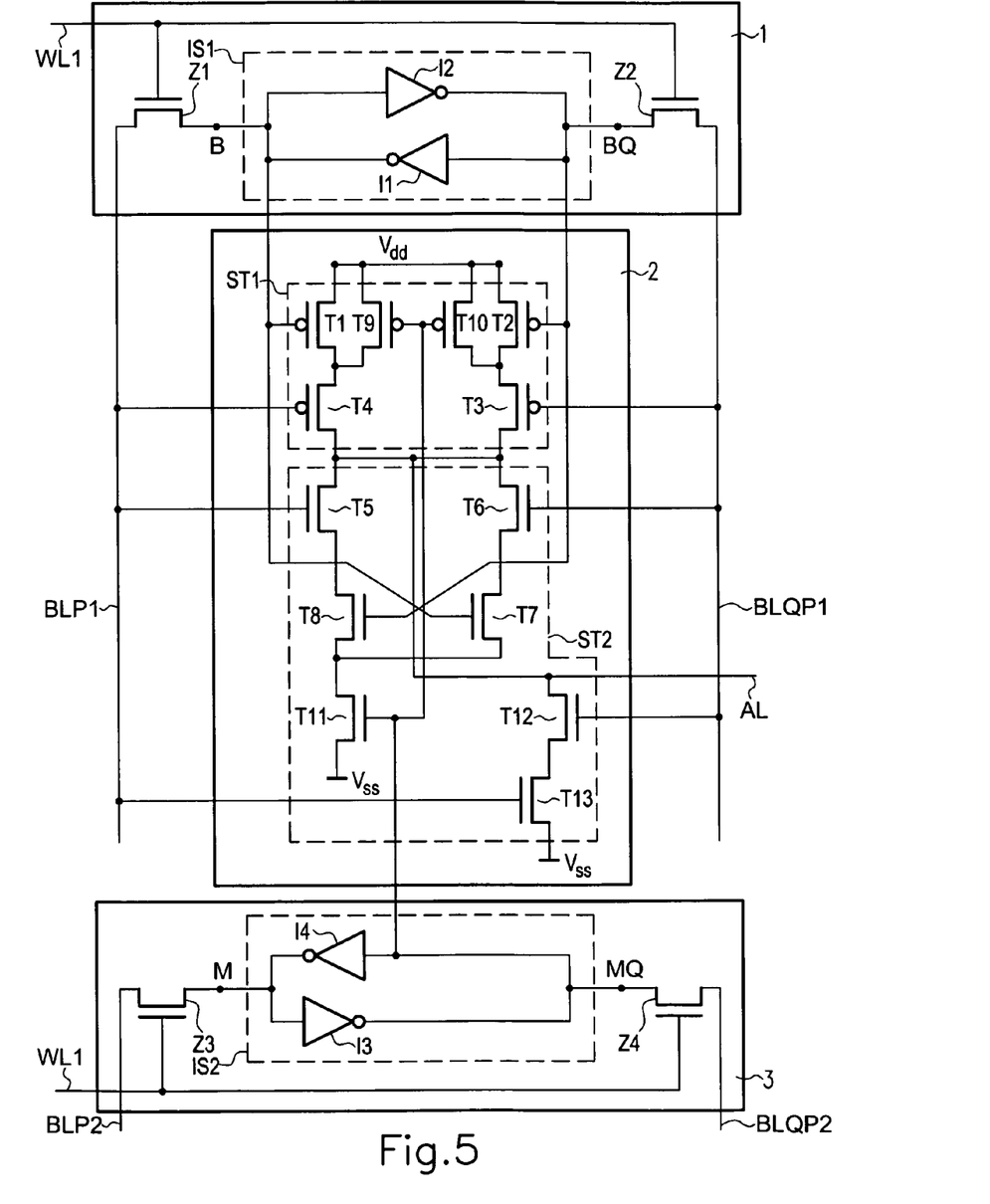
FIG. 5 shows a content addressable memory cell according to a third exemplary embodiment of the invention.

A further exemplary embodiment is illustrated in FIG. 5. In this example, all of the access transistors Z1 and Z2 of the first memory cell 1 and the access transistors Z3 and Z4 of the second memory cell 3 are connected to the word line WL1. However, in this exemplary embodiment, the source terminal of the access transistor Z3 is connected to a first bit line BLP2 of a second bit line pair and the source terminal of the access transistor Z4 is connected to a second bit line BLQP2 of the second bit line pair. This enables both a data bit and a mask bit to be written to the corresponding memory cells in a write cycle.

Figure 6:
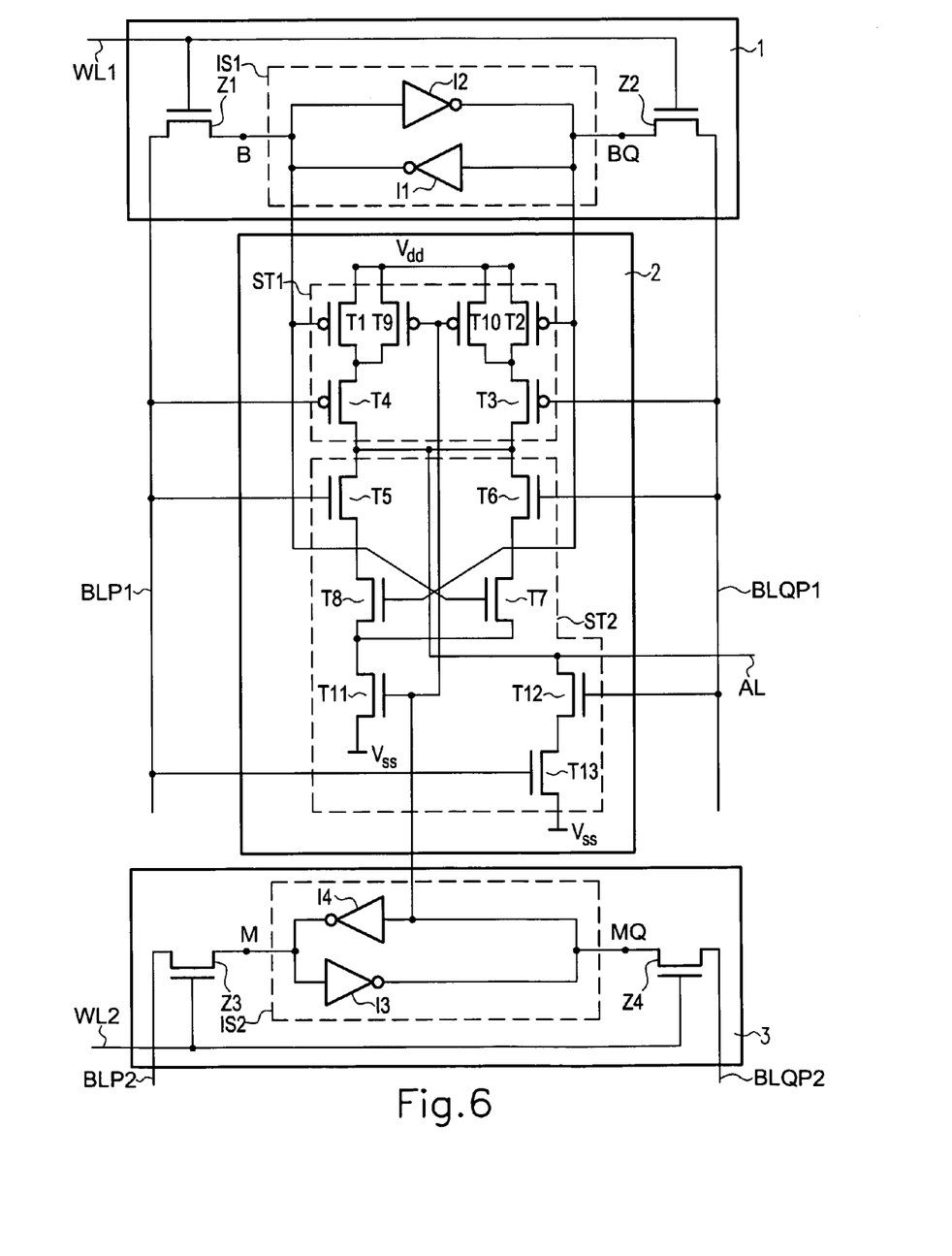
FIG. 6 shows a content addressable memory cell according to a fourth exemplary embodiment of the invention.

FIG. 6 illustrates a further exemplary embodiment of a content addressable memory cell. The basic circuit corresponds generally to that of FIGS. 4 and 5. One difference is that the access transistors Z1 and Z2 of the first memory cell 1 are electrically connected to the first word line WL1 and the access transistors Z3 and Z4 are electrically connected to the second word line WL2. Furthermore, the source terminals of the access transistors Z3 and Z4 are connected to bit lines BLP2 and BLQP2, respectively, in accordance with the exemplary embodiment in FIG. 5. This exemplary embodiment enables a data bit and a mask bit either to both be written to the corresponding memory cells in one write cycle or else to be written separately in a plurality of write cycles.

As a result, a plurality of operating modes of the content addressable memory cell may be provided.

Figure 7:
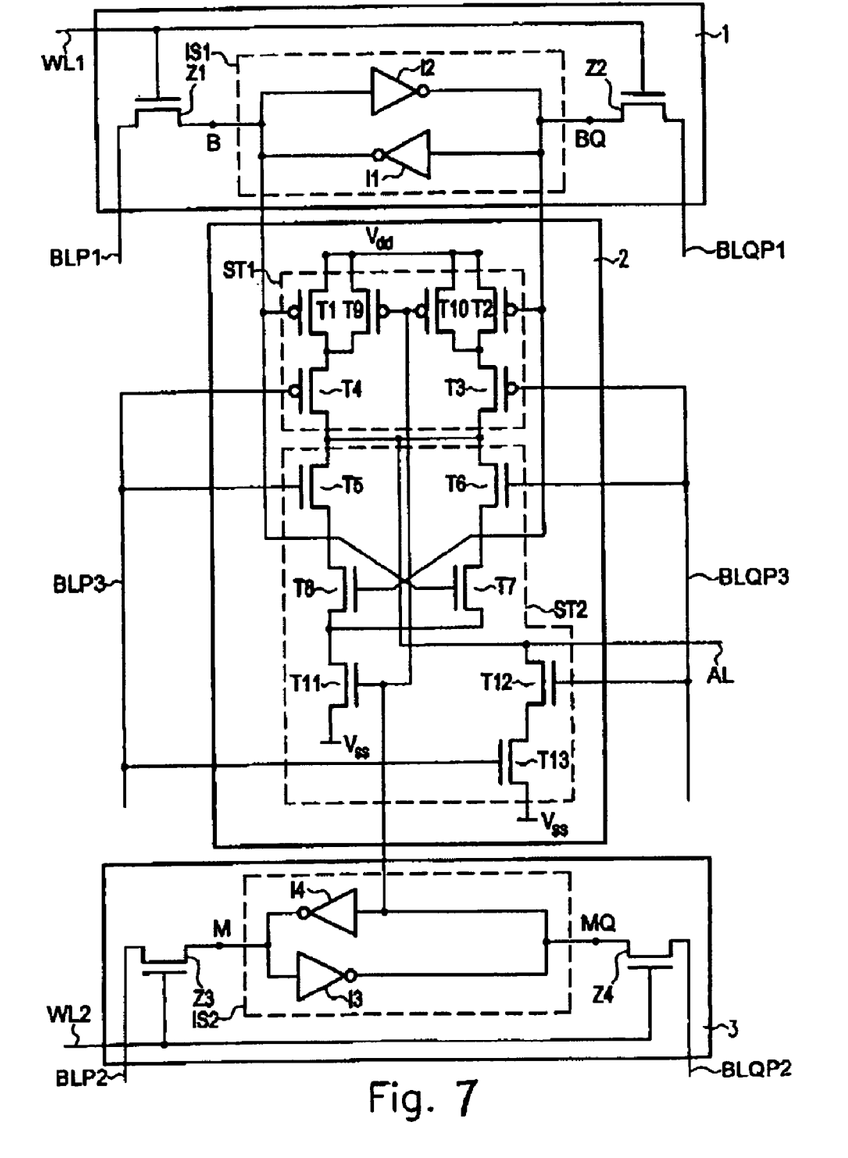
FIG. 7 shows a content addressable memory cell according to a fifth exemplary embodiment of the invention.

A fourth exemplary embodiment of a ternary CAM cell is illustrated in FIG. 7. The interconnection of the access transistors Z1 to Z4 to the word lines WL1 and WL2 and also to the bit lines BLP1, BLQP1, BLP2 and BLQP2 corresponds generally to that in accordance with FIG. 6. However, in this exemplary embodiment, the transistors T4 and T5 of the comparator unit 2 are connected to a first bit line BLP3 of a third bit line pair and the transistors T3 and T6 are connected to a second bit line BLQP3 of the third bit line pair. The advantage of this embodiment is that a smaller capacitance (i.e., in comparison with the other embodiments described previously) is subjected to charge reversal for the reading, writing and comparison, respectively. Furthermore, this interconnection alternative makes it possible to suppress an assessment of the adjustment during a read/write operation, which results in a lower power loss.

A further development can be realized in that the interconnection of the first memory cell 1 and the comparator unit 2 to the corresponding word and bit lines is embodied in accordance with FIG. 7 and that the access transistors Z3 and Z4 of the second memory cell 3 are likewise connected to the first word line WL1 by their gate terminals and are connected to the corresponding bit lines of the first or the second bit line pair by their source terminals. Provision may also be made for embodying the interconnection in accordance with FIG. 7 and making a change in that the source terminals of the access transistors Z3 and Z4 are connected, however, to the bit lines BLP1 and BLQP1, respectively.

The way in which the mask bits are written to the memory cells or are read therefrom is relatively unimportant for the invention. According to embodiments of the invention, however, the masking information is not fixedly predetermined once, but rather individual bits or entire partial words are permitted to be masked out by the setting of a corresponding masking information item during a subsequent search. As a result, a search algorithm for the respective application may be changed even during its execution.

Embodiments of the invention provide a content addressable memory cell having a basic construction that serves as a basis both for a binary CAM cell and for a ternary CAM cell. The interconnection of the RAM memory cell and the comparator unit guarantees a high security with regard to an unauthorized data access or a data manipulation, particularly for applications in the case of smart cards. Furthermore, a high functionality of the CAM cells, in particular the mask functionality of the ternary CAM cells, with regard to the required variability thereof in different applications is ensured. For this purpose, the comparator unit includes at least eight transistors for the realization of a binary CAM cell and at least thirteen transistors for the realization of a ternary CAM cell, which transistors are connected up in the comparator unit and to the rest of the elements of the entire CAM cell in such a way that the CAM cell does not have a floating node, rather the interconnection constitutes a complete static problem solution approach.

While the foregoing is directed to embodiments of the present invention, other and further embodiments of the invention may be devised without departing from the basic scope thereof, and the scope thereof is determined by the claims that follow.

What is claimed is:

1. A content addressable memory cell, comprising:
    a first memory cell for storing data, the first memory cell comprising an inverter circuit and a first and a second access transistors electrically connected to a first word line;
    a first bit line pair electrically connected to the first memory cell for transferring data to and from the first memory cell;
    a comparator unit electrically connected to the first memory cell; and
    an adjusting line electrically connected to the comparator unit, wherein the comparator unit comprises:
        a first circuit part and a second circuit part, each circuit part having a first circuit branch and a second circuit branch, the first circuit part comprising a first plurality of transistors of a first conduction type and the second circuit part comprising a second plurality of transistors of a second conduction type, each circuit branch of the first circuit part having a first end connected to a supply voltage potential and a second end electrically connected to the adjusting line via a first node, each circuit branch of the second circuit part being electrically connected by a first end to the adjusting line via the first node,
        wherein the first circuit part comprises:
            in the first circuit branch, a first transistor connected in series with a second transistor, the first transistor being electrically connected via a respective gate terminal to a first output of the first memory cell; and
            in the second circuit branch, a third transistor connected in series with a fourth transistor, the third transistor being electrically connected via a respective gate terminal to a second output of the first memory cell, and
        wherein the second circuit part comprises:
            in the first circuit branch, a fifth transistor connected in series with a sixth transistor, the sixth transistor being electrically connected via a respective gate terminal to the second output of the first memory cell; and
            in the second circuit branch, a seventh transistor connected in series with an eighth transistor, the eighth transistor being electrically connected via a respective gate terminal to the first output of the first memory cell; and
        wherein the second transistor and the fifth transistor are electrically connected via respective gate terminals to a first bit line of the first bit line pair and wherein the fourth transistor and the seventh transistor are electrically connected via respective gate terminals to a second bit line of the first bit line pair.

2. The content addressable memory cell of claim 1, wherein the fifth transistor is connected in series with the second transistor and wherein the fourth transistor is connected in series with the seventh transistor.

3. The content addressable memory cell of claim 2, wherein a second end of each circuit branch of the second circuit part is connected to a ground potential.

4. The content addressable memory cell of claim 2, wherein the first circuit branch of the first circuit part further comprises a ninth transistor connected in parallel with the first transistor and wherein the second circuit branch of the first circuit part further comprises a tenth transistor connected in parallel with the third transistor.

5. The content addressable memory cell of claim 4, wherein the comparator unit further comprises:
    an eleventh transistor of the second conduction type connected to a second end of each branch of the second circuit part; and
    a twelfth transistor and a thirteenth transistor of the second conduction type connected in series and electrically connected to the adjusting line via a first end and electrically connected to a ground potential via a second end.

6. The content addressable memory cell of claim 5, wherein the twelfth transistor is connected to the second bit line of the first bit line pair via a respective gate terminal and wherein the thirteenth transistor is connected to the first bit line of the first bit line pair via a respective gate terminal.

7. The content addressable memory cell of claim 6, wherein the ninth transistor and the tenth transistor are connected via respective gate terminals.

8. The content addressable memory cell of claim 7, wherein the eleventh transistor is connected to ground potential via a first terminal and connected to the ninth and tenth transistors via respective gate terminals.

9. The content addressable memory cell of claim 8, further comprising:
a second memory cell for storing a mask bit, the second memory cell comprising a second inverter circuit and a third and fourth access transistors, wherein the inverter circuit is connected to respective gate terminals of the ninth, tenth and eleventh transistors.

10. The content addressable memory cell of claim 9, wherein the third access transistor is electrically connected to a first bit line of a second bit line pair and via a respective gate terminal to the first word line and wherein the fourth access transistor is electrically connected to a second bit line of the second bit line pair and via a respective gate terminal to the first word line.

11. The content addressable memory cell of claim 9, wherein the third access transistor is electrically connected to the first bit line of the first bit line pair and via a respective gate terminal to a second word line and wherein the fourth access transistor is electrically connected to the second bit line of the first bit line pair and via a respective gate terminal to the second word line.

12. The content addressable memory cell of claim 9, wherein the third access transistor is electrically connected to a first bit line of a second bit line pair and via a respective gate terminal to a second word line and wherein the fourth access transistor is electrically connected to a second bit line of the second bit line pair and via a respective gate terminal to the second word line.

13. The content addressable memory cell of claim 12, wherein respective gate terminals of the second transistor, fifth transistor, and thirteenth transistor are connected to a first bit line of a third bit line pair and wherein the respective gate terminals of the fourth transistor, seventh transistor, and twelfth transistor are connected to a second bit line of the third bit line pair.

14. The content addressable memory cell of claim 1, wherein the transistors of the first conduction type are selected from p-channel transistors and n-channel transistors and wherein the transistors of the second conduction type are opposite to the selected first conduction type.

15. A content addressable memory cell, comprising:
a first memory cell for storing data, the first memory cell comprising an inverter circuit and a first and a second access transistors electrically connected to a first word line;
a second memory cell for storing mask data, wherein the second memory cell is connected to one of the first word line and a second word line;
a first bit line pair electrically connected to the first memory cell for transferring data to and from the first memory cell;
a comparator means for comparing data stared in the first memory cell with a comparison data provided on the first bit line pair, the comparator means configured to provide programmable mask functionality, the comparator means comprising a first circuit part and second circuit part, each circuit part comprising a first branch and a second branch, each branch comprising a plurality of series-connected transistor means for switching between on and off states, wherein the transistor means are of one type in the first part and of an opposite type in the second part; and
an adjusting line electrically connected to each branch of the comparator unit at a first node;
wherein the second memory cell is connected to one of the first bit line pair and a second bit line pair and wherein the comparator means is connected to one of the first bit line pair and a third bit line pair.

16. A ternary content addressable memory cell, comprising:
a first memory cell for storing data, the memory cell being constructed from two access transistors and two inverters, the access transistors being connected to a first word line;
a first bit line pair for transferring the data to and from the memory cell, the first bit line pair being electrically connected to the first memory cell;
a comparator unit electrically connected to the first memory cell;
an adjusting line electrically connected to the comparator unit,
wherein the comparator unit comprises:
a first circuit part comprising two circuit branches which are connected at a first end thereof via a first node with a supply voltage potential, each circuit branch comprising two serially connected transistors of a first conduction type, and are connected at a second end thereof via a second node with the adjusting line, respectively,
wherein a first transistor of a first circuit branch of the first circuit part is electrically connected by its gate terminal with a first output of the first memory cell and a second transistor of a second circuit branch of the first circuit part is electrically connected by its gate terminal with a second output of the first memory cell,
wherein a third transistor which is contained in the second circuit branch of the first circuit part is electrically connected by its gate terminal with one of:
a second bit line of the first bit line pair; and
a second bit line of the second bit line pair;
wherein a fourth transistor, which is contained in the first circuit branch of the first circuit part, is electrically connected by its gate terminal with one of:
a first bit line of the first bit line pair; and
a first bit line of a second bit line pair;
a second circuit part comprising:
an eleventh transistor of a second conduction type which is connected by its first terminal with a ground potential terminal;
two circuit branches, each circuit branch having two serially connected transistors of a second conduction type and which are connected at a second end thereof via a node with a second terminal of the eleventh transistor and at a first end thereof via the first node with the adjusting line, wherein a fifth transistor, which is contained in the first circuit branch of the second circuit part, is electrically connected by its gate terminal with one of:
the first bit line of the first bit line pair; and
the first bit line of the second bit line pair;
wherein a sixth transistor, which is contained in the second circuit branch of the second circuit part, is electrically connected by its gate terminal with one of:
the second bit line of the first bit line pair; and
the second bit line of the second bit line pair;
wherein a seventh transistor of the second circuit branch of the second circuit part being electrically connected by its gate terminal to the first output of the first memory cell;
wherein an eighth transistor of the first circuit branch of the second circuit part is electrically connected by its gate terminal to the second output of the first memory cell;
a ninth transistor of the first conduction type connected between the supply voltage potential and a node between the first and the fourth transistors;
a tenth transistor of the first conduction type connected between the supply voltage potential and a node between the second and the third transistors;
wherein the gate terminals of the ninth, tenth and eleventh transistors are connected with each other; and
a twelfth transistor and a thirteenth transistor of the second conduction type connected serially between a node of the adjusting line and the ground potential terminal, herein the gate terminal of the twelfth transistor is connected with one of:
the second bit line of the first bit line pair; and
the second bit line of the second bit line pair;
wherein the gate terminal of the thirteenth transistor is connected with one of:
the first bit line of the first bit line pair; and
the first bit line of the second bit line pair; and
a second memory cell for storing a mask bit, which comprises two access transistors and two inverters, the second memory cell being electrically connected to the gate terminals of the ninth, tenth and eleventh transistors of the comparator unit.

17. The ternary content addressable memory cell of claim 16, wherein the gate terminal of the eleventh transistor is electrically connected with an input of a first inverter of the second memory cell.

18. The ternary content addressable memory cell of claim 16,
wherein a first terminal of the first access transistor of the second memory cell is electrically connected with first bit line of the first bit line pair and a gate terminal of the first access transistor is connected with a second word line; and
wherein a first terminal of the second access transistor of the second memory cell is electrically connected with the second bit line of the second bit line pair and a gate terminal of the second access transistor is connected with the second word line.

19. The ternary content addressable memory cell of claim 16,
wherein a first terminal of the first access transistor of the second memory cell is electrically connected with the first bit line of the second bit line pair and the gate terminal of the first access transistor with the first word line; and
wherein a first terminal of the second access transistor of the second memory cell is electrically connected with the second bit line of the second bit line pair and a gate terminal of the second access transistor is connected with the first word line.

20. The ternary content addressable memory cell of claim 16,
wherein a first terminal of the first access transistor of the second memory cell is electrically connected with first bit line of the second bit line pair and a gate terminal of the first access transistor is connected with a second word line; and
wherein a first terminal of the second access transistor of the second memory cell is electrically connected with the second bit line of the second bit line pair and a gate terminal of the second access transistor is connected with the second word line.

21. The ternary content addressable memory cell of claim 16,
wherein the fourth transistor, which is contained in the first circuit branch of the first circuit part, and the fifth transistor, which is contained in the first circuit branch of the second circuit part, are electrically connected by their gate terminals to the first bit line of the first bit line pair, respectively; and
wherein the third transistor, which is contained in the second circuit branch of the first circuit part, and the sixth transistor, which is contained in the second circuit branch of the second circuit part, are electrically connected by their gate terminals to the second bit line of the first bit line pair, respectively.

22. The ternary content addressable memory cell of claim 16,
wherein the fourth transistor, which is contained in the first circuit branch of the first circuit part, and the fifth transistor, which is contained in the first circuit branch of the second circuit part, are electrically connected by their gate terminals to the first bit line of the second bit line pair; and
wherein the third transistor, which is contained in the second circuit branch of the first circuit part, and the sixth transistor, which is contained in the second circuit branch of the second circuit part, are electrically connected by their gate terminals to the second bit line of the second bit line pair.

23. The ternary content addressable memory cell of claim 16, wherein the transistors of the first conduction type are selected from p-channel transistors and n-channel transistors and wherein the transistors of the second conduction type are opposite to the selected first conduction type.

* * * * *